United States Patent
Horng

(10) Patent No.: US 6,305,067 B1
(45) Date of Patent: Oct. 23, 2001

(54) ELASTIC PLATE STRUCTURE FOR PREVENTING ELECTROMAGNETIC INTERFERENCE AND MANUFACTURING METHOD FOR THE SAME

(76) Inventor: Chin Fu Horng, No. 9, Lane 90, Fu Hsing Rd., Lu Chou, Taipei Hsien (TW)

( * ) Notice: Subject to any disclaimer, the term of this patent is extended or adjusted under 35 U.S.C. 154(b) by 0 days.

(21) Appl. No.: 09/477,287

(22) Filed: Jan. 4, 2000

(51) Int. Cl.$^7$ ................................................. B23P 25/00
(52) U.S. Cl. ........................ 29/458; 361/816; 361/818; 174/35 R; 29/885
(58) Field of Search ............................ 29/622, 885, 884, 29/874, 882, 527.2, 458; 361/800, 816, 818; 174/35 R

(56) References Cited

U.S. PATENT DOCUMENTS

| | | | |
|---|---|---|---|
| 2,206,662 | * 7/1940 | Conradi et al. | 29/874 |
| 5,193,271 | * 3/1993 | Kato | 29/885 |
| 5,225,629 | * 7/1993 | Garrett | 174/35 R |
| 5,307,562 | * 5/1994 | Denlinger et al. | 29/885 |
| 6,005,186 | * 12/1999 | Bachman | 174/35 R |

FOREIGN PATENT DOCUMENTS

56167272-A * 12/1981 (JP) ........................................ 29/874

OTHER PUBLICATIONS

Archambeault et al., Effects of corrosion on the electrical properties of conducted finishes for EMI shielding 1989, IEEE, 1989 National Symposium on Electromagnetic Compatability, p. 46–51.*

* cited by examiner

Primary Examiner—David P. Bryant
Assistant Examiner—Jermie E. Cozart
(74) Attorney, Agent, or Firm—Rosenberg, Klein & Lee

(57) ABSTRACT

A manufacturing method of elastic plate structure for preventing electromagnetic interference comprises step of: preparing a Be—Cu plate and performing thermal treatment to the Be—Cu plate; electroplating the Be—Cu plate; punching and processing the Be—Cu plate to form elastic plate structure for preventing EMI. The above-manufactured Be—Cu plate has the advantages of excellent conductivity, flexibility, low resistance and non-oxidation, thus providing added-value to product using the elastic plate structure.

3 Claims, 4 Drawing Sheets

ELASTIC PLATE STRUCTURE FOR PREVENTING ELECTROMAGNETIC INTERFERENCE AND MANUFACTURING METHOD FOR THE SAME

FIELD OF THE INVENTION

The present invention relates to an elastic plate for preventing electromagnetic interference and manufacturing method for the same, more particularly, to an elastic plate to shield microprocessor and memory on motherboard of computer from electromagnetic interference and manufacturing method for the same.

BACKGROUND OF THE INVENTION

The conventional means to prevent electromagnetic interference (EMI) involves conductive sponge placed on the peripheral of the microprocessor and the memory of computer and attached to a hollow housing, thus providing EMI shielding for the microprocessor and the memory.

However, the conductive sponge is arranged manually, the process is cumbersome and the cost is high.

It is the object of the present invention to provide an elastic plate structure for preventing electromagnetic interference, which has automatic manufacture process with low cost.

To achieve the above object, the elastic plate according to the present invention uses thermally-treated Be—Cu (beryllium-copper) plate as base material, and the Be—Cu plate is electroplated and punched to form an elastic plate structure for preventing electromagnetic interference.

The various objects and advantages of the present invention will be more readily understood from the following detailed description when read in conjunction with the appended drawing, in which:

DETAIL DESCRIPTION OF PREFERRED EMBODIMENT

Figure 1:
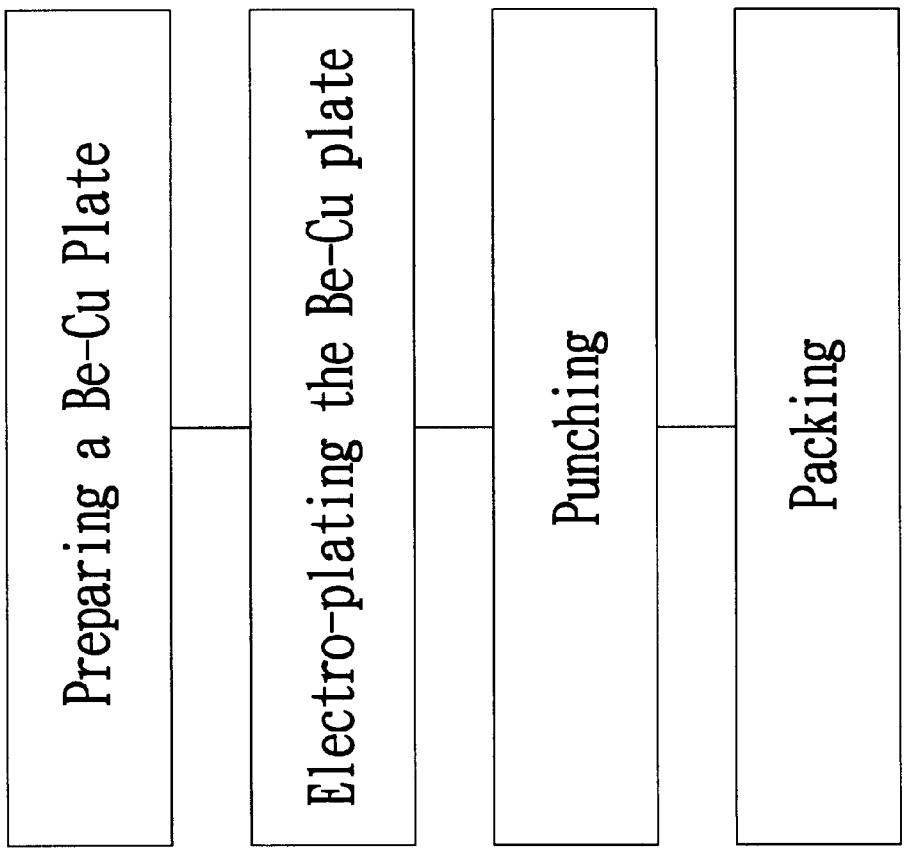
FIG. 1 is the flowchart of the manufacture process of the elastic plate structure for preventing EMI according to the present invention.

FIG. 1 is the flowchart of the manufacture process of the elastic plate structure for preventing EMI according to the present invention. As shown in this figure, the manufacture process of the elastic plate structure according to the present invention comprises following steps:

(1) preparing a Be—Cu plate and performing thermal treatment to the Be—Cu plate, thus the Be—Cu plate has high stiffness;

(2) electroplating the Be—Cu plate preferably with Au or Sn—Pb alloy;

(3) punching and processing the Be—Cu plate to form elastic plate structure for preventing EMI; and (4) packaging The above-manufactured Be—Cu plate to form elastic plate structure for preventing EMI according to the present invention has the advantages of excellent conductivity, flexibility, low resistance and non-oxidation, thus providing added-value to product using the elastic plate structure.

Figure 2:
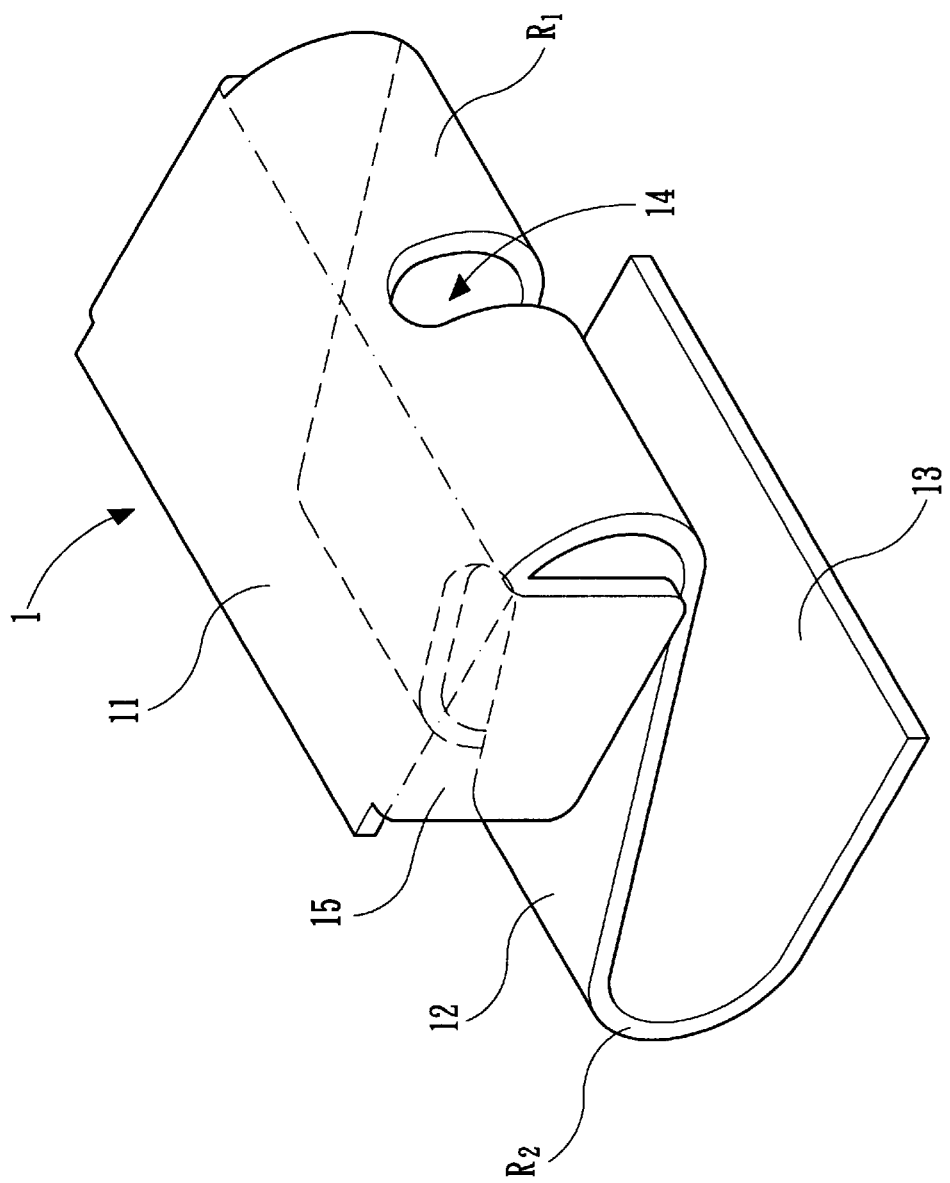
FIG. 2 is the perspective view of the elastic plate structure for preventing EMI according to the present invention.
Figure 3:
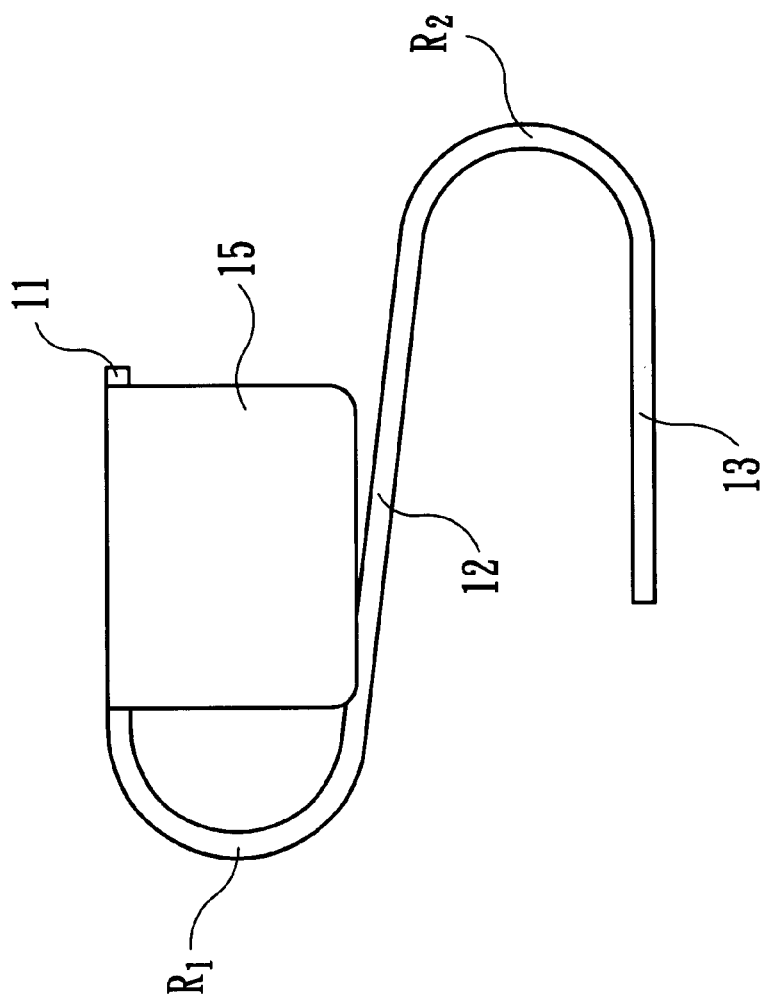
FIG. 3 is the sectional view of the elastic plate structure for preventing EMI according to the present invention.

FIGS. 2 and 3 are the perspective and sectional views of the elastic plate structure 1 for preventing EMI according to the present invention, respectively. The elastic plate structure 1 is manufactured with the thermally-treated and electroplated Be—Cu plate and has a rectangular contact plate 11, which will be in contact with a housing. A flat panel 12 is extended from one lengthwise side of the rectangular contact plate 11 and a first bent portion R1 is formed to bridge the rectangular contact plate 11 and the panel 12. A slit 14 is formed by punching at the center of the first bent portion R1. Two side plates 15 are extended from the width-side of the rectangular contact plate 11 and adjacent to the first bent portion R1. A solder plate 13 is extended downward from the free end of the panel 12 and a second bent portion R2 is formed to bridge the panel 12 and the solder plate 13. The inner side of the first bent portion R1 is opposite to the inner side of the second bent portion R2.

The above-manufactured Be—Cu plate 1 according to the present invention has the advantages of excellent conductivity, flexibility, low resistance and non-oxidation, thus providing added-value to product using the elastic plate structure.

Figure 4:
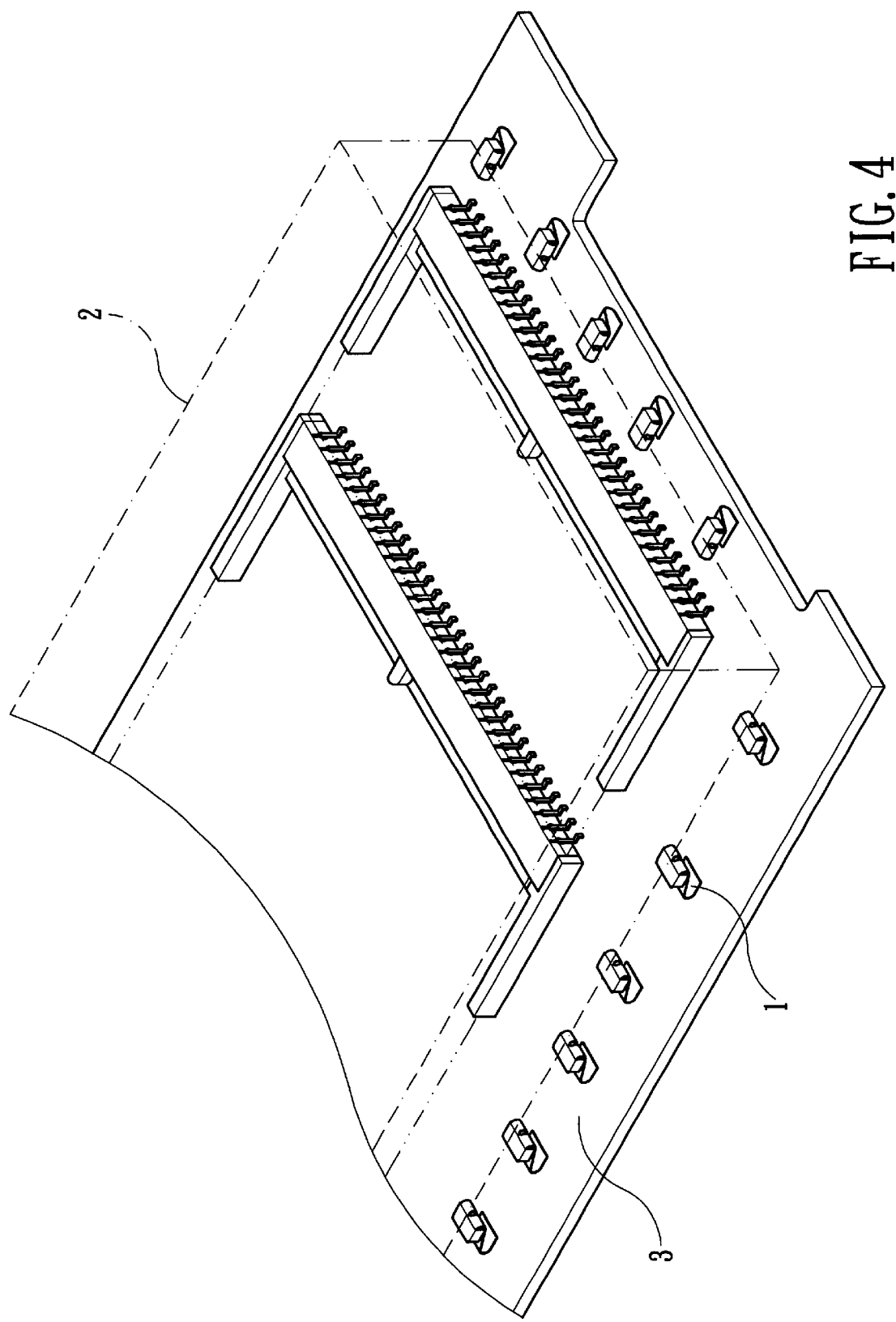
FIG. 4 shows the application of the elastic plate structure according to the present invention on a computer motherboard.

FIG. 4 shows the application of the elastic plate structure according to the present invention on a computer motherboard. A plurality of above-manufactured Be—Cu plates 1 are arranged at the adjacent area of the microprocessor and the memory on the computer motherboard 3. The separation between two adjacent Be—Cu plates 1 depends on the performance of the microprocessor. For example, the separation is 2 cm for lower performance microprocessor and 1.5 cm for higher performance microprocessor. However, the separation is such chosen that EMI can be shielded. Moreover, housing is assembled to contact the rectangular contact plate 11 of each Be—Cu plate 1, thus shielding EMI from the microprocessor and the memory.

To sum up, the elastic plate structure according to the present invention can be used to provide EMI shielding for microprocessor and the memory and can be manufactured with automatic process. Therefore, the elastic plate structure according to the present invention can advantageously replace the conventional conductive sponge.

Although the present invention has been described with reference to the preferred embodiment thereof, it will be understood that the invention is not limited to the details thereof Various substitutions and modifications have suggested in the foregoing description, and other will occur to those of ordinary skill in the art. For example, the contact plate is plated with Au, the solder plate is plated with Sn—Pb alloy, or the contact plate and the solder plate are all plated with Sn—Pb alloy. Therefore, all such substitutions and modifications are intended to be embraced within the scope of the invention as defined in the appended claims.

What is claimed is:

1. A manufacturing method of an elastic plate structure for preventing electromagnetic interference comprising the steps of:

(a) providing a beryllium-copper plate;

(b) thermally-treating said beryllium-copper plate to provide high stiffness thereto;

(c) electroplating said thermally-treated beryllium-copper plate;

(d) punching and forming said electroplated beryllium-copper plate into a serpentine contour to form an elastic plate; and, (e) mounting a plurality of said elastic plates to a circuit board adjacent an area of a microprocessor and memory for contact with a housing thereof.

2. The method as recited in claim 1, wherein said step of mounting includes the step of spacing said elastic plates one from another by a distance within an approximating range of 1.5–2.0 cm.

3. The method as recited in claim 1, wherein said step of electroplating includes the step of electroplating with a material selected from the group consisting of gold and a tin-lead alloy.

* * * * *